United States Patent [19]

Vanderknyff

[11] 4,272,741
[45] Jun. 9, 1981

[54] INDUCTIVE DELAY LINE AND METHOD OF MAKING

[75] Inventor: Jacobus J. M. Vanderknyff, Oceanside, Calif.

[73] Assignee: Varian Associates, Palo Alto, Calif.

[21] Appl. No.: 27,992

[22] Filed: Apr. 9, 1979

[51] Int. Cl.³ .................. H03H 7/20; H03H 7/32; H03H 3/00

[52] U.S. Cl. .................. 333/138; 29/607; 333/140

[58] Field of Search .................. 333/138–140, 333/23, 156; 336/69, 83, 180, 181, 185, 208, 90, 110, 200, 214, 199; 29/602 R, 605, 606, 607

[56] References Cited

U.S. PATENT DOCUMENTS

| | | | |
|---|---|---|---|
| 3,327,299 | 6/1967 | Johnson | 333/138 X |
| 3,755,762 | 8/1973 | Boulin et al. | 333/185 |

*Primary Examiner*—Marvin L. Nussbaum
*Attorney, Agent, or Firm*—Stanley Z. Cole; Peter J. Sgarbossa

[57] ABSTRACT

A delay line having an inductive component in which inductive windings are made on multiple post bobbin units to maintain spacing and alignment. Two multiple bobbin units are collectively wound and then secured together with the bobbins interfitting to form a rigid, precisely aligned element, with the wires from each bobbin positioned for ease of connection. The inductive component is mounted on the base of a dual in-line package (DIP), capacitors are secured in the inductive component and the electrical connections are made to connect the inductors and capacitors to the contact pins of the DIP. The assembly is then potted or otherwise enclosed for protection.

11 Claims, 11 Drawing Figures

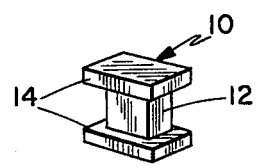
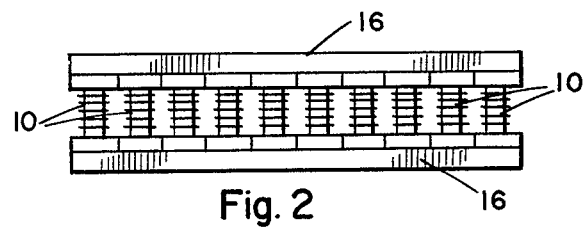
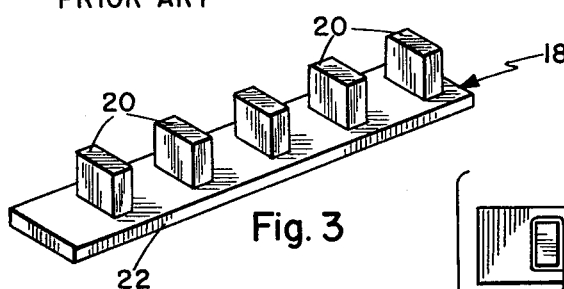
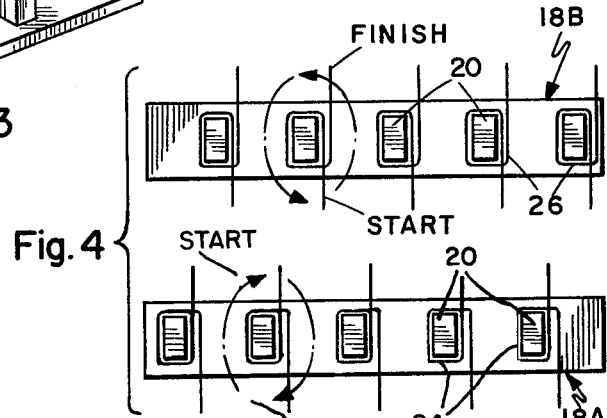
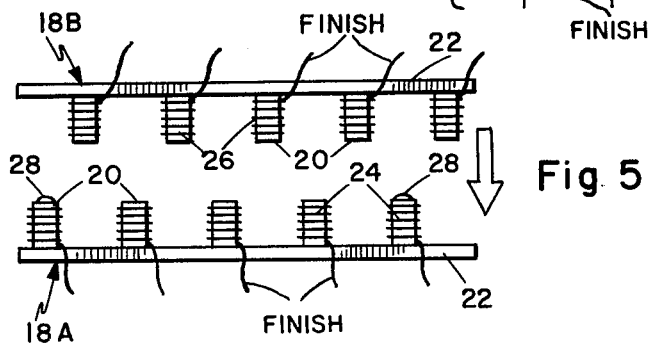
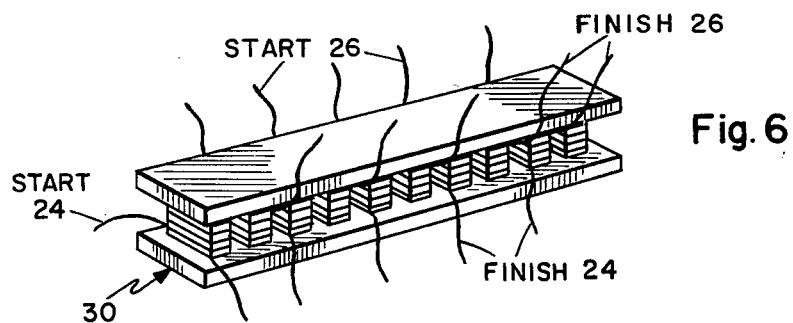

INDUCTIVE DELAY LINE AND METHOD OF MAKING

BACKGROUND OF THE INVENTION

A delay line provides a series of timed pulses from a single input pulse and is used in the clock circuit of a compute memory, as one example. The typical delay line comprises a series of inductors and capacitors, the circuit being well known. In the very small sizes of delay lines in use the wire wound inductance elements are difficult to make and assemble accurately. One type of inductive element comprises spaced windings along a rod and another type has windings on individual bobbins. The bobbins are preferred since they give lower distortion and lower attenuation in the delay line.

The accepted technique for making the bobbin type assembly is to wind each bobbin individually, often by hand, then assemble a number of bobbins in a row and mount them in a suitable supporting and connecting structure. It is a tedious task and uniformity of winding and consistency in the number of turns are difficult to maintain. Some idea of the difficulty can be realized by the fact that a typical bobbin is on the order of 2.5×2.5×1.5 mm in size. Mounting such small bobbins in an even row and maintaining the alignment during electrical connection and final packaging of the component is also a problem. Since any misalignment of the bobbins and windings can cause changes in electrical performance, precise alignment is desirable for consistancy. Completing the electrical connections of such small elements can also be difficult if the wire ends are not positioned and organized in a suitable manner during assembly.

SUMMARY OF THE INVENTION

The component described herein is constructed in such a manner that precise alignment of the inductive elements is ensured, electrical connection is simplified and a neat compact package is produced. The inductive component is composed of a pair of multiple bobbin units, each having a plurality of posts of ferrite material fixed to or formed integrally with an elongated connecting plate. The posts are spaced so that the posts of the two units interfit in a single row, with the connecting plates forming outside walls.

Wire coils are wound on the posts of each bobbin unit simultaneously, with the start and finish of the winding action arranged so that the wire ends are positioned for simple connection of the windings in series when the two bobbin units are interfitted. The bobbin units are secured together in a rigid assembly, which is mounted on the base of a conventional type of DIP with one connecting plate forming a platform. A row of capacitors is mounted on the platform and electrical connections are made between the capacitors and the inductive windings to the pins of the DIP. The completed assembly is then potted or otherwise enclosed for protection.

The primary object of this invention, therefore, is to provide a new and improved inductive delay line.

Another object of this invention is to provide a delay line having an inductive component with multiple windings in a rigid, precisely aligned assembly.

A further object of this invention is to provide a delay line which is assembled in such a manner that the connections to the inductive windings are positioned for ease of interconnection.

Other objects and advantages will be apparent in the following detailed description, taken in conjunction with the accompanying drawings, in which:

FIG. 1 illustrates a bobbin of the type which is manually wound.

FIG. 2 is a side elevation view of a delay line of prior art type, with individual bobbins secured to supporting structure.

FIG. 3 is a perspective view of a multiple bobbin unit.

FIG. 4 illustrates the winding technique used on the bobbin units.

FIG. 5 illustrates the interfitting of two bobbin units.

FIG. 6 is a side elevation view of the assembled inductive component.

DESCRIPTION OF THE PREFERRED EMBODIMENT

Figure 7:
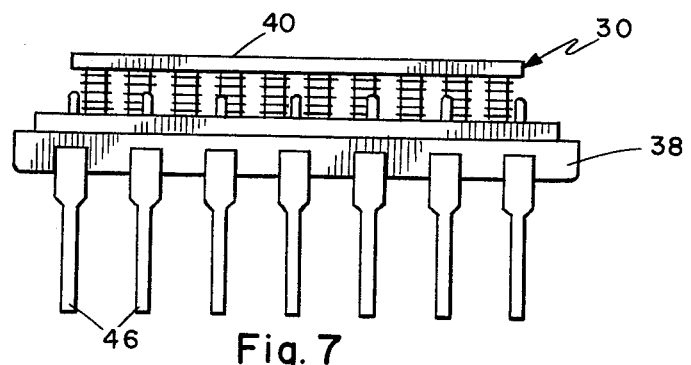
FIG. 7 is a side elevation view of the inductive component on a DIP base.

The individual bobbin 10 of the prior art type, shown in FIG. 1, has a rectangular post 12 with end flanges 14. Wire is wound on the bobbin, usually by hand, and several wound bobbins are secured in a row between non-magnetic connecting plates 16, as in FIG. 2. In some assemblies the bobbins are wrapped with adhesive tape to hold them together. With hand winding the quality and even the number of turns can vary, and it is difficult to align the very small bobbins precisely on their supports. Also, great care must be taken to orient the bobbins and their wire coils, so that the bobbins can be connected in series in the correct polarity.

This problem is avoided by using bobbin elements 18, as in FIG. 3, and applying a particular winding and assembly technique. In the bobbin element 18, a plurality of posts 20 are spaced along an elongated connecting plate 22 and project perpendicularly from one side of the plate. The element is preferably an integral structure of ferrite material, resin bonded powdered iron, or similar magnetic material. Two such bobbin elements are used to make the inductive component, the posts 20 being spaced so that the posts of the two elements interfit in a single row with the connecting plates 22 forming outer walls of the assembly. As shown, each bobbin has five posts to make a ten coil inductor, which is practical for most uses of a delay line.

Winding and assembly of the inductive component is best accomplished with apparatus described in a co-pending application entitled Apparatus for Making an Inductive Delay Line Component Ser. No. 28,232, filed Apr. 9, 1979. In this apparatus, two bobbin elements 18A and 18B are wound simultaneously in the manner indicated in FIG. 4, with the elements in side by side relation. As illustrated, windings 24 on element 18A are wound in a clockwise direction and windings 26 on element 18B are wound in a counter-clockwise direction. The windings are also oriented so that the start ends of windings 24 confront the start ends of windings 26. This simplifies interconnection after assembly.

The bobbin elements are joined by applying adhesive 28 to the ends of two or more of the posts 20 and bringing the two elements together with the posts interfitting, as in FIG. 5. The adhesive coated posts are bonded to the connecting plate 22 of the opposite bobbin element, securing the two elements together to form the inductive component 30, shown in FIG. 6. Connecting plates 22 thus form the outer walls of a generally rectangular block, with the row of precisely spaced and aligned bobbins along the center. In the apparatus described in the above mentioned copending application, the bobbin elements are wound and joined automatically in sequence, the finished components remaining in a string on the wires until separated for use. When an individual component is cut from the string, the start and finish ends of the windings are oriented as in FIG. 6, so that by connecting start wire ends in sequence along one side and finish wire ends in sequence along the other side, the windings are connected in series with correct polarity.

Figure 11:
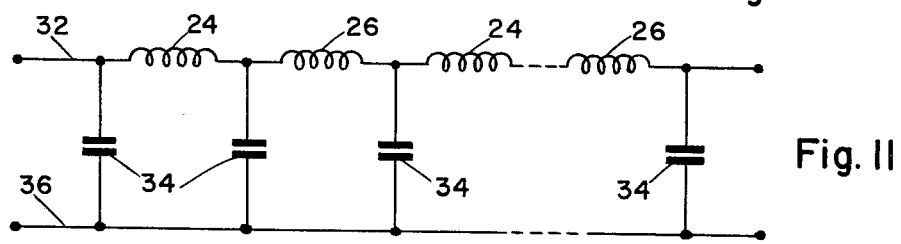
FIG. 11 is a schematic wiring diagram of the delay line.

The basic circuit of the delay line is well known and is shown in FIG. 11. The windings 24 and 26 are connected in series in one conductor 32, and each end of each winding is connected through a capacitor 34 to a common conductor 36. The circuit may be tapped at any junction of inductor and capacitor.

As illustrated in FIG. 7, the inductive comooent 30 is secured by adhesive or other suitable means to the base 38 of dual in-line package or DIP, with one connecting plate uppermost to provide a platform 40. A conventional 14 pin DIP is shown, which has sufficient connections for the ten coil inductor.

Figure 8:
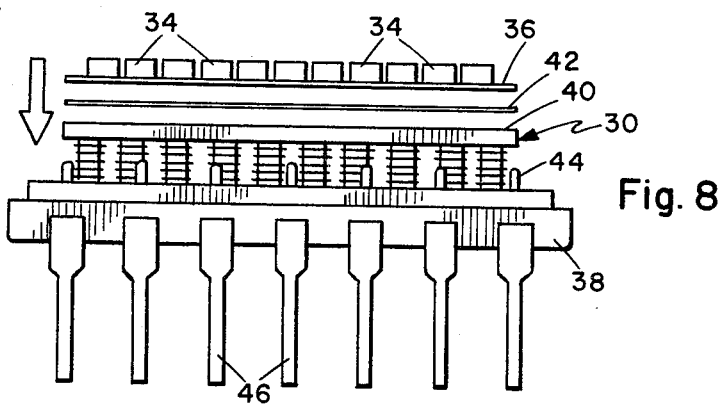
FIG. 8 is a similar view showing the counting of the capacitors.

In FIG. 8 the capacitors 34 are shown mounted in a row on a conductive support strip, which acts as the common conductor 36. The capacitor strip is then mounted on platform 40 by suitable means, such as an adhesive strip 42, which can also serve as an insulator if required.

Figures 9, 10:
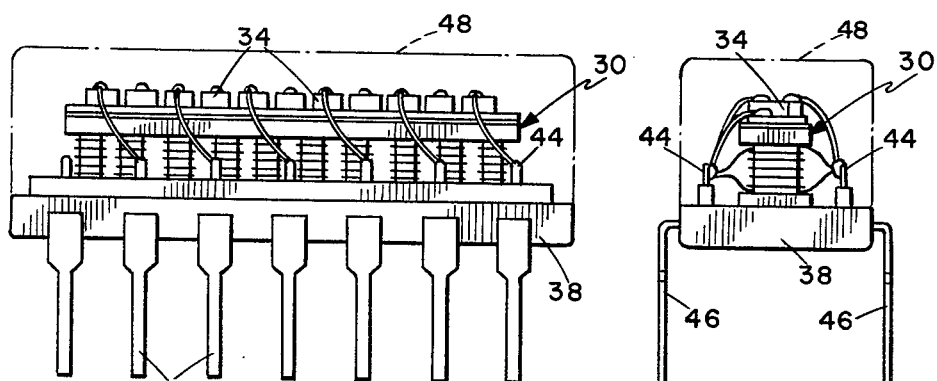
FIG. 9 is a side elevation view of the completed delay line.
FIG. 10 is an end view of the completed delay line.

As illustrated in FIGS. 10 and 11, the capacitors and inductive windings are then connected to the connecting lugs 44 of the DIP, which are extensions of external pins 46. The exact order of connection will depend on the particular pin connection pattern established for the component. For protection the completed circuitry is enclosed by a cover 48, indicated in broken line, which may be a hollow cover secured to base 38, or a solid block of potting compound molded in place.

The use of the multiple bobbin elements results in a great reduction in the time and effort needed to produce the component, while the precise alignment and uniformity of the inductive elements ensure consistency of electrical and magnetic characteristics. The delay line is thus adapted for production in quantity at minimum cost. It should be understood that the DIP is one convenient way of packaging the delay line and other configurations may be used to suit specific circuit requirements. Also, the number of posts in the bobbin units may vary according to the particular magnetic properties required.

Having described my invention, I claim:

1. An inductive delay line, including an inductive component comprising a pair of multiple bobbin elements, each having an elongated connecting plate with a plurality of posts of inductive material projecting perpendicularly from one side, the posts on each element being spaced to interfit with the posts of the other element when the two elements are joined with the connecting plates forming a spaced parallel pair of outside walls of the component and with said posts extending in a row therebetween in longitudinally spaced relationship; and a wire coil inductive winding on each of said posts.

2. An inductive delay line according to claim 1, wherein each of said bobbin elements is an integral structure of inductive material.

3. An inductive delay line according to claim 1, and including a base on which said inductive component is mounted, said base having a plurality of conductive pins for connection of the windings thereto.

4. An inductive delay according to claim 3, and including a plurality of capacitors mounted on said inductive component, said capacitors having a common conductor;
said windings being connected in series, and each end of each winding being connected through one of the capacitors to the common conductor.

5. An inductive delay line according to claim 4, wherein one of said connecting plates defines a platform;
said common conductor being an elongated conductive strip on which said capacitors are secured, said conductive strip being attached to said platform.

6. The method of making an inductive delay line, comprising:
forming, at least partially from inductive material, a pair of multiple bobbin elements each having an elongated connecting plate with a row of spaced posts projecting from one side;
winding wire coils around each of the posts;
and joining the bobbin elements with the posts interfitting in a single row and the connecting plates forming outer walls of an inductive component.

7. The method of claim 6, wherein, with the bobbin elements in side by side relation, the coils on one set of posts are wound in one direction and the coils on the other set of posts are wound in the opposite direction, with the finish ends of the wires of one bobbin element confronting the starting end of the wires of the other.

8. The method of claim 6, wherein the step of joining the bobbin elements includes applying adhesive to certain of the posts on at least one bobbin element to bond to the connecting plate of the other bobbin element.

9. The method of claim 6, and including mounting the inductive component on a DIP base having multiple connecting pins, with one connecting plate forming a platform;
mounting on the platform a plurality of capacitors;
and connecting the capacitors and coils to the connecting pins to provide a delay line circuit.

10. The method of claim 9, which further includes attaching the capacitors to a conductive strip which is a common connector for the capacitors, and securing the conductive strip to the platform.

11. The method of claim 10, and including attaching a protective cover to the DIP base to enclose the inductive component, the capacitors and their connections.

* * * * *